US012375095B2

(12) United States Patent
Meher et al.

(10) Patent No.: US 12,375,095 B2
(45) Date of Patent: Jul. 29, 2025

(54) DIGITAL-TO-ANALOG CONVERTER CIRCUIT WITH LINEAR PROGRAMMABLE GAIN STAGE

(71) Applicant: TEXAS INSTRUMENTS INCORPORATED, Dallas, TX (US)

(72) Inventors: Deepak Kumar Meher, Bengaluru (IN); Gautam Nandi, Bengaluru (IN); Tarun Purohit, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 244 days.

(21) Appl. No.: 18/326,398

(22) Filed: May 31, 2023

(65) Prior Publication Data
US 2024/0313794 A1      Sep. 19, 2024

(30) Foreign Application Priority Data

Mar. 14, 2023    (IN) .............................. 202341016837

(51) Int. Cl.
  *H03M 1/10*   (2006.01)
  *H03M 1/66*   (2006.01)
(52) U.S. Cl.
  CPC ............ *H03M 1/1023* (2013.01); *H03M 1/66* (2013.01)
(58) Field of Classification Search
  CPC ..... H03M 1/1023; H03M 1/66; H03M 1/0614
  USPC ........................................ 341/120, 139, 144
  See application file for complete search history.

(56) References Cited

U.S. PATENT DOCUMENTS

| | | | |
|---|---|---|---|
| 8,525,710 B1 | 9/2013 | Tsang et al. | |
| 9,306,588 B2 * | 4/2016 | Das | H03M 1/0845 |
| 9,967,665 B2 * | 5/2018 | Das | H03F 3/45596 |
| 2017/0126244 A1 | 5/2017 | Nandi et al. | |

FOREIGN PATENT DOCUMENTS

| | | |
|---|---|---|
| CN | 103166616 B | 9/2016 |
| CN | 110601682 A | 12/2019 |
| WO | 2022090475 A1 | 5/2022 |

OTHER PUBLICATIONS

International Search Report for PCT/US2024/021026, dated Jun. 18, 2024.
Guo Wenjuan, et al., An Area-and Power-Efficient, Compensation Technique for Voltage-Mode., IEEE Transactions on Circuits and Systems II: Express Briefs, IEEE, USA vol. 62, No. 7, Jul. 1, 2015 (Jul. 1, 2015), pp. 656-660, XP011585932.
Machine Translation for CN110601682A.
Machine Translation for CN103166616B.

* cited by examiner

*Primary Examiner* — Khai M Nguyen
(74) *Attorney, Agent, or Firm* — Mandy Barsilai Fernandez; Frank D. Cimino

(57) ABSTRACT

A circuit includes a digital-to-analog converter and a gain stage. The gain stage includes: an operational amplifier; a variable gain network; and a leakage current control circuit. A first input of the operational amplifier is coupled to an input of the gain stage. An output of the operational amplifier is coupled to an output of the gain stage. A first terminal of the variable gain network is coupled to the second input of the operational amplifier. A second terminal of the variable gain network is coupled to the output of the operational amplifier. A first terminal of the leakage current control circuit is coupled to the output of the operational amplifier. A second terminal of the leakage current control circuit coupled to a third terminal of the variable gain network.

20 Claims, 11 Drawing Sheets

DIGITAL-TO-ANALOG CONVERTER
CIRCUIT WITH LINEAR PROGRAMMABLE
GAIN STAGE

CROSS REFERENCE TO RELATED APPLICATION

The present application is related to: India Provisional Application No. 202341016837, titled "18-BIT LINEAR PROGRAMMABLE GAIN-STAGE WITH WIDE OUTPUT RANGE", filed on Mar. 14, 2023, which is hereby incorporated by reference in its entirety.

BACKGROUND

Digital-to-analog converters (DACs) are included in many integrated circuits (ICs) to convert digital signals to analog signals. Different DACs vary with regard to speed, resolution, accuracy, and output voltage range. To improve a DAC's output range, a gain stage may be included at the output of the DAC. Two issues affect the accuracy or integral non-linearity (INL) of a DAC and gain stage topology. One issue is leakage current in the gain stage. The other issue is disturbance in the DAC ground when sharing a ground with the gain stage.

SUMMARY

In an example, a circuit includes: a digital-to-analog converter (DAC) having an input and an output; and a gain stage having an input and an output, the input of the gain stage coupled to the output of the DAC. The gain stage includes an operational amplifier having a first input, a second input, and an output, the first input of the operational amplifier coupled to the input of the gain stage, the output of the operational amplifier coupled to the output of the gain stage. The gain stage also includes a variable gain network having a first terminal, a second terminal, and a third terminal, the first terminal of the variable gain network coupled to the second input of the operational amplifier, the second terminal of the variable gain network coupled to the output of the operational amplifier. The gain stage also includes a leakage current control circuit having a first terminal and a second terminal, the first terminal of the leakage current control circuit coupled to the output of the operational amplifier, and the second terminal of the leakage current control circuit coupled to the third terminal of the variable gain network.

In another example, a circuit includes: common ground control circuitry having a first terminal, a second terminal, a third terminal; a DAC having an input, an output, and a first ground terminal, the first ground terminal coupled to the first terminal of the common ground control circuitry; and a gain stage having an input, an output, and a second ground terminal, the input of the gain stage coupled to the output of the DAC, and the second ground terminal coupled to the second terminal of the common ground control circuitry. The gain stage includes an operational amplifier having a first input, a second input, and an output, the first input of the operational amplifier coupled to the input of the gain stage, the output of the operational amplifier coupled to the output of the gain stage. The gain stage also includes a variable gain network having a first terminal, a second terminal, and a third terminal, the first terminal of the variable gain network coupled to the second input of the operational amplifier, the second terminal of the variable gain network coupled to the output of the operational amplifier. The gain stage also includes a leakage current control circuit having a first terminal and a second terminal, the first terminal of the leakage current control circuit coupled to the output of the operational amplifier, and the second terminal of the leakage current control circuit coupled to the third terminal of the variable gain network.

In yet another example, a circuit includes: a DAC having an input, an output, and a first ground terminal; a gain stage having a first input, a second input, an output, and a second ground terminal, the input of the gain stage coupled to the output of the DAC; and common ground control circuitry having a first terminal, a second terminal, and a third terminal, the first terminal of the common ground control circuitry coupled to the first ground terminal, the second terminal of the common ground control circuitry coupled to the second ground terminal. The DAC is configured to: receive a code at its input; and provide an analog signal at its output responsive to the code. The gain stage is configured to: receive the analog signal at its first input; receive a gain control signal at its second input; generate a leakage current control signal based on the analog signal; and provide an output voltage responsive to the analog signal, the gain control signal, and the leakage current control signal. The common ground control circuitry is configured to: provide a first impedance between the first and third terminals of the common ground control circuitry; and provide a second impedance between the second and third terminals of the common ground control circuitry.

DETAILED DESCRIPTION

Figure 1:
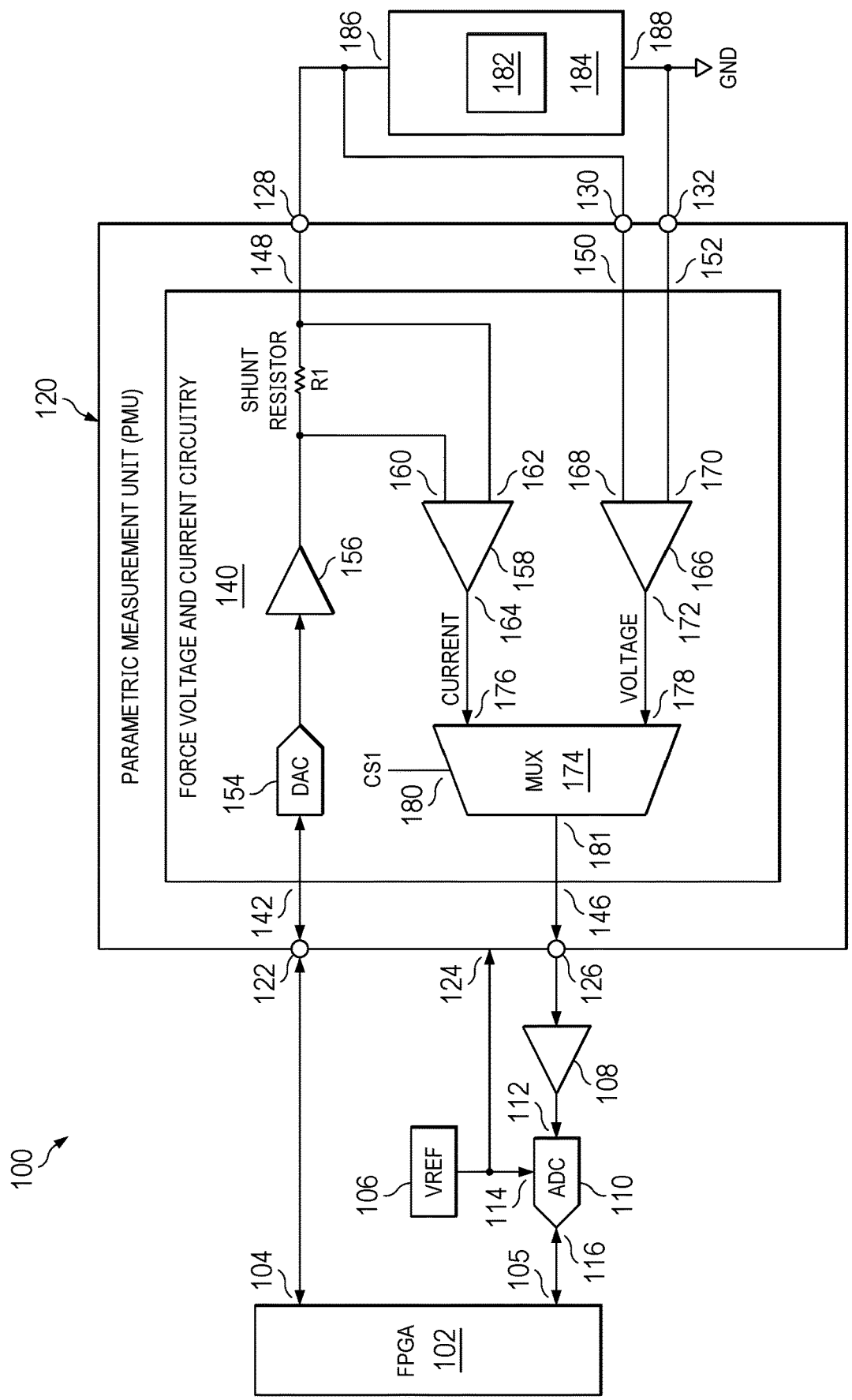
FIG. 1 is a block diagram of an example system.

The same reference numbers or other reference designators are used in the drawings to designate the same or similar features. Such features may be the same or similar either by function and/or structure.

Described herein are digital-to-analog converter (DAC) circuits that include a DAC core and a programmable gain stage. As used herein, a "DAC core" refers to a circuit that generates an analog signal (VFDAC) as a function of a digital input code (D or "code" herein) and a reference voltage (VREF). The operation of the DAC core follows the equation VFDAC=VREF*D/$2^N$, where N is the number of bits in D. The topology of a DAC core may be a resistor matrix topology (e.g., an R2R ladder topology, or a resistor string topology), or another topology. As used herein, a "programmable gain stage" refers to a circuit that receives an analog input (e.g., VFDAC) and provides an analog output (e.g., VOUT), where the voltage range of the analog output is increased relative to the analog input. A programmable gain stage may also be referred to as an "adjustable gain stage."

Example DAC circuits operate to: receive a digital input code (hereafter abbreviated to "code" herein); receive mode control signals to program (i.e., adjust) the output range of the programmable gain stage; generate a leakage current control signal; and provide an analog signal responsive to the code, the mode control signals, and the leakage current control signal. The code is a multi-bit code (e.g., an 18-bit code or other multi-bit code). In some examples, the mode control signals determine the gain and output range of the programmable gain stage. The leakage current control signal and related leakage current reduction circuitry improves linearity of example DAC circuits. Another option to improve linearity of example DAC circuits involves use of common ground control circuitry for the DAC core and the programmable gain stage. The common ground control circuitry accounts for and reduces the effect of the programmable gain stage's variable ground current (e.g., variance as a function of the code) on the DAC core's ground current. Stabilizing the DAC core's ground current in this manner improves linearity of example DAC circuits.

FIG. 1 is a block diagram of an example system 100. In some examples, the system 100 represents an automated test equipment (ATE) environment or other device under test (DUT) environment. As shown, the system 100 includes a field-programmable gate array (FPGA) 102, a parametric measurement unit (PMU) 120, and a DUT 182. In some examples, the FPGA 102, the PMU 120, and DUT 182 are separate integrated circuits (ICs). Other components of the system 100 include a reference voltage (VREF) source 106, a buffer 108, an analog-to-digital converter (ADC) 110, and a printed circuit board (PCB) 184.

As shown, the FPGA has a first terminal 104 and a second terminal 105. The VREF source 106 has a terminal. The buffer 108 has a first terminal and a second terminal. The ADC 110 has a first terminal 112, a second terminal 114, and a third terminal 116. The PMU 120 has a first terminal 122, a second terminal 124, a third terminal 126, a fourth terminal 128, a fifth terminal 130, and a sixth terminal 132. The PCB 184 has a first terminal 186 and second terminal 188.

In the example of FIG. 1, the PMU 120 includes force voltage and current circuitry 140 and is used to force and measure voltage and current into the DUT 182. The force voltage and current circuitry 140 has a first terminal 142, a second terminal 146, a third terminal 148, a fourth terminal 150, and a fifth terminal 152. In some examples, the force voltage and current circuitry 140 includes a DAC circuit 154, a buffer 156, resistor R1, a first sense amplifier 158, a second sense amplifier 166, and a multiplexer 174. In the example of FIG. 1, the first sense amplifier 158 is a voltage sense amplifier, and the second sense amplifier 166 is a current sense amplifier.

The DAC circuit 154 has a first terminal and a second terminal. The buffer 156 has a first terminal and a second terminal. The resistor R1 has a first terminal and a second terminal. The first sense amplifier 158 has a first terminal 160, a second terminal 162, and a third terminal 164. The second sense amplifier 166 has a first terminal 168, a second terminal 170, and a third terminal 172. The multiplexer 174 has a first terminal 176, a second terminal 178, a third terminal 180, and a fourth terminal 181.

The first terminal 122 of the PMU 120 is coupled to the first terminal 104 of the FPGA 102. The second terminal 124 of the PMU 120 is coupled to the terminal of the VREF source 106. The third terminal 126 of the PMU 120 is coupled to the first terminal of the buffer 108. The second terminal of the buffer 108 is coupled to the first terminal 112 of the ADC 110. The second terminal 114 of the ADC 110 is coupled to the output of the VREF source 106. The third terminal 116 of the ADC 110 is coupled to the second terminal 105 of the FPGA 102. The fourth terminal 128 of the PMU 120 is coupled to the first terminal 186 of the PCB 184. The fifth terminal 130 of the PMU 120 is coupled to the first terminal 186 of the PCB 184. The sixth terminal 132 of the PMU 120 is coupled to the second terminal 188 of the PCB 184.

The first terminal 122 of the PMU 120 is also coupled to the first terminal 142 of the force voltage and current circuitry 140. The third terminal 126 of the PMU 120 is coupled to the second terminal 146 of the force voltage and current circuitry 140. The fourth terminal 128 of the PMU 120 is coupled to the third terminal 148 of the force voltage and current circuitry 140. The fifth terminal 130 of the PMU 120 is coupled to the fourth terminal 150 of the force voltage and current circuitry 140. The sixth terminal 132 of the PMU 120 is coupled to the fifth terminal 152 of the force voltage and current circuitry 140.

The first terminal of the DAC circuit 154 is coupled to the first terminal 142 of force voltage and current circuitry 140. The second terminal of the DAC circuit 154 is coupled to the first terminal of the buffer 156. The second terminal of the buffer 156 is coupled to the first terminal of the resistor R1 and to the first terminal 160 of the first sense amplifier 158. The second terminal of the resistor R1 is coupled to the third terminal 148 of the force voltage and current circuitry 140 and to the second terminal 162 of the first sense amplifier 158. The third terminal 164 of the first sense amplifier 158 is coupled to the first terminal 176 of the multiplexer 174. The first terminal 168 of the second sense amplifier 166 is coupled to the fourth terminal 150 of the force voltage and current circuitry 140. The second terminal 170 of the second sense amplifier 166 is coupled to the fifth terminal 152 of the force voltage and current circuitry 140. The third terminal 172 of the second sense amplifier 166 is coupled to the second terminal 178 of the multiplexer 174.

In operation, the FPGA 102 operates to: provide digital control signals at its first terminal 104; receive digitized measurement results from the DUT 182 at its second terminal 105 responsive to the digital control signals and the operations of the PMU 120; and store/analyze the digitized measurement results.

The PMU 120 operates to: receive the digital control signals at its first terminal 122; receive VREF at its second terminal 124; provide force voltages and/or force currents at its fourth terminal 128 responsive to the digital control signals, VREF, the operations of the force voltage and current circuitry 140; obtain a sense current to the DUT 182 responsive to the force voltages and/or force currents and the operations of the force voltage and current circuitry 140; obtain a sense voltage across the DUT 182 responsive to the force voltages and/or force currents and the operations of the force voltage and current circuitry 140; and provide the sense current or sense voltage at its third terminal 126 responsive to the operations of the force voltage and current circuitry 140.

The DAC circuit 154 of the force voltage and current circuitry 140 operates to: receive the digital control signals; and provide an analog signal responsive to the digital control signals. The buffer 156 operates to buffer the analog signal provided by the DAC circuit 154 to provide a force voltage and/or force current. The force voltage and/or force current is provided to the DUT 182 via the resistor R1. The voltage drop across the resistor R1 and the operations of the first sense amplifier 158 are used to determine the sense current.

The first sense amplifier 158 operates to: receive a first voltage at the first terminal of the resistor R1 at its first terminal 160; receive a second voltage at the second terminal of the resistor R1 at its second terminal 162; and provide the sense current at its third terminal 164 responsive to the first and second voltages. The voltages at the fifth terminal 130 and the sixth terminal 132 of the PMU 120 and the operations of the second sense amplifier 166 are used to determine the sense voltage.

The second sense amplifier 166 operates to: receive the second voltage at the second terminal of the resistor R1 (in this example, at the first terminal 186 of the PCB 184) at its first terminal 168; receive a third voltage at the second terminal 188 of the PCB 184 at its second terminal 170; and provide the sense voltage at third terminal 172 responsive to the second and third voltages.

The multiplexer 174 operates to: receive the sense current at its first terminal 176; receive the sense voltage at its second terminal 178; receive a control signal (CS1) at its third terminal 180; and provide the sense current or the sense voltage at its fourth terminal 181 responsive to CS1.

In some examples, the DAC circuit 154 includes a DAC core and a programmable gain stage. The DAC circuit 154 operates to: receive a code (e.g., a digital control signal from the FPGA 102); receive mode control signals to program the output range of the programmable gain stage; generate a leakage current control signal; and provide the analog signal responsive to the code, the mode control signals, and the leakage current control signal. In some examples, the mode control signals set the gain and output range of the programmable gain stage. The leakage current control signal and related leakage current reduction circuitry improves linearity of the DAC circuit 154. Another option to improve linearity of the DAC circuit 154 involves use of common ground control circuitry for the DAC core and programmable gain stage.

Figure 2:
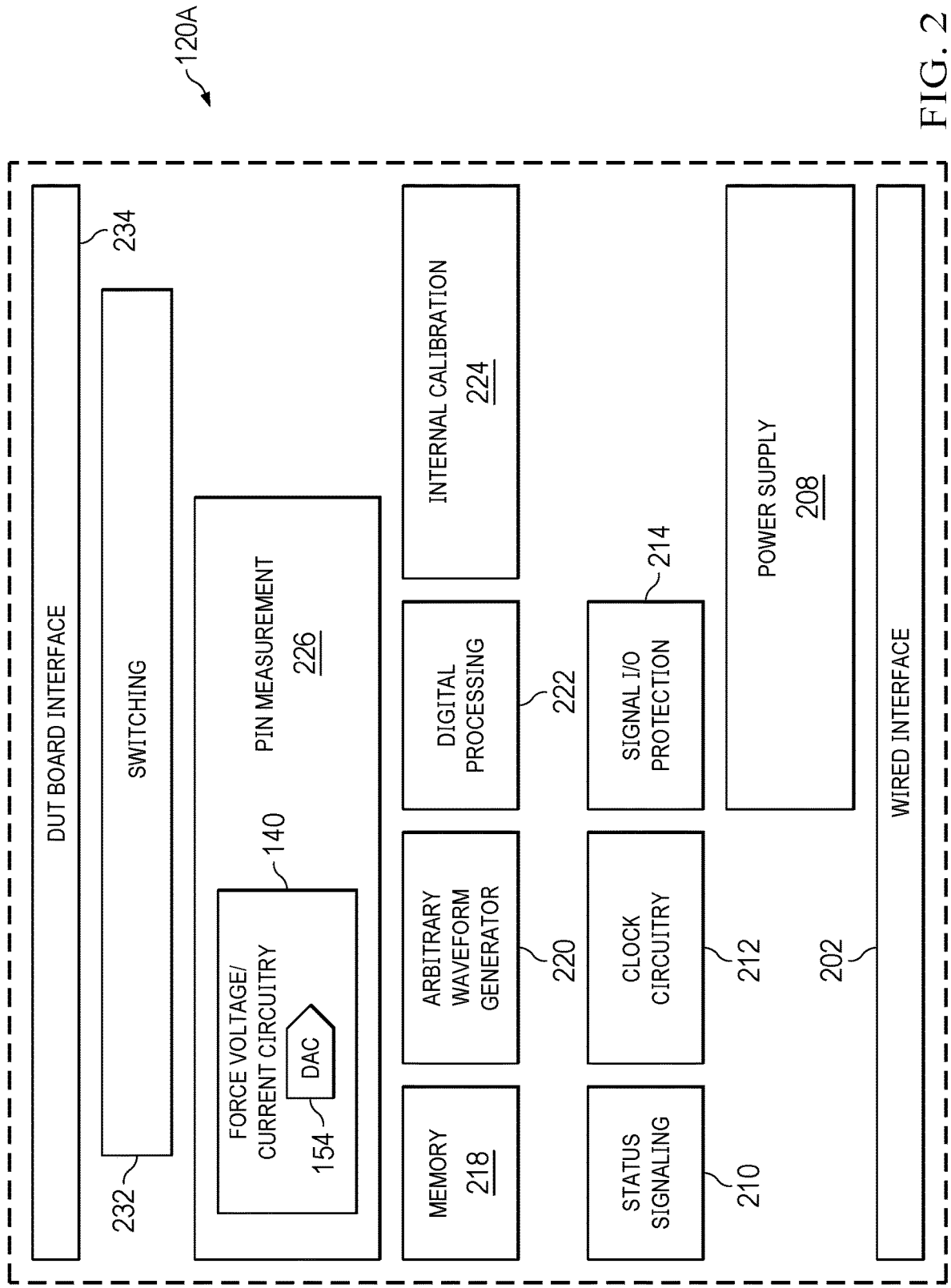
FIG. 2 is a block diagram of an example parametric measurement unit.

FIG. 2 is a block diagram of an example PMU 120A. The PMU 120A is an example of the PMU 120 in FIG. 1. As shown, the PMU 120A includes a wired interface 202, power supply circuitry 208, status signaling circuitry 210, clock circuitry 212, signal input/output (I/O) protection circuitry 214, memory circuitry 218, arbitrary waveform generator circuitry 220, digital processing circuitry 222, internal calibration circuitry 224, pin measurement circuitry 226, switching circuitry 232, and a DUT board interface 234. In some examples, the pin measurement circuitry 226 includes the force voltage and current circuitry 140 and DAC circuit 154 described in FIG. 1.

Without limitation, the wired interface 202 may include digital isolator circuitry, receiver circuitry, a serial communication interface (e.g., 12C), a serial peripheral interface (SPI), a voltage level translator, and/or other components. Without limitation, the power supply circuitry 208 may include direct-current to direct-current (DC-DC) converters, low dropout regulator (LDOs), or other voltage/current regulators. In some examples, the power supply circuitry 208 is omitted (e.g., external power converters and/or LDOs may be used).

Examples of the status signaling circuitry 210 includes a light-emitting diode (LED) driver and related control circuitry. Examples of the clock circuitry 212 include oscillator circuitry, a clock generator, a clock buffer, and a phase-locked loop (PLL). Examples of the signal I/O protection circuitry 214 include electrostatic discharge (ESD) protection circuitry and transient-voltage-protection (TVP) circuitry. Examples of the memory circuitry 218 include synchronous dynamic random access memory (SDRAM), flash memory, memory power and interface circuitry, and voltage level translator circuitry. Examples of the arbitrary waveform generator circuitry 220 include a DAC, a low-pass filter (LPF), a buffer, and a multiplexer. Examples of digital processing circuitry 222 includes a processor, a digital signal processor (DSP), or an FPGA.

Examples of the internal calibration circuitry 224 include circuitry for temperature sensing, current sensing, voltage reference control, gain setting control, a digital potentiometer, buffers, and an I/O interface. Without limitation, the internal calibration circuitry 224 may: determine the gain and offset for each PMU channel and each mode; perform force voltage calibration; perform measure voltage calibration; perform force current calibration; perform measure current calibration; adjust or overwrite default settings for DACs and/or other control circuitry responsive to determined gains, determined offsets, and/or calibration results.

Examples of the switching circuitry 232 include multiplexers, I/O expanders, switches, logic, electrically-erasable programmable read-only memory (EEPROM), and relays. In some examples, the PMU 210A may also include internal calibration circuitry, sense voltage/sense current circuitry, digitizer circuitry, and/or components. With the DAC circuit 154, the accuracy of the force current and/or force voltage levels for DUT operations meets a target criteria. In some examples, the DAC circuit 154 is an 18-bit DAC with accuracy to within 1 LSB.

Figure 3:
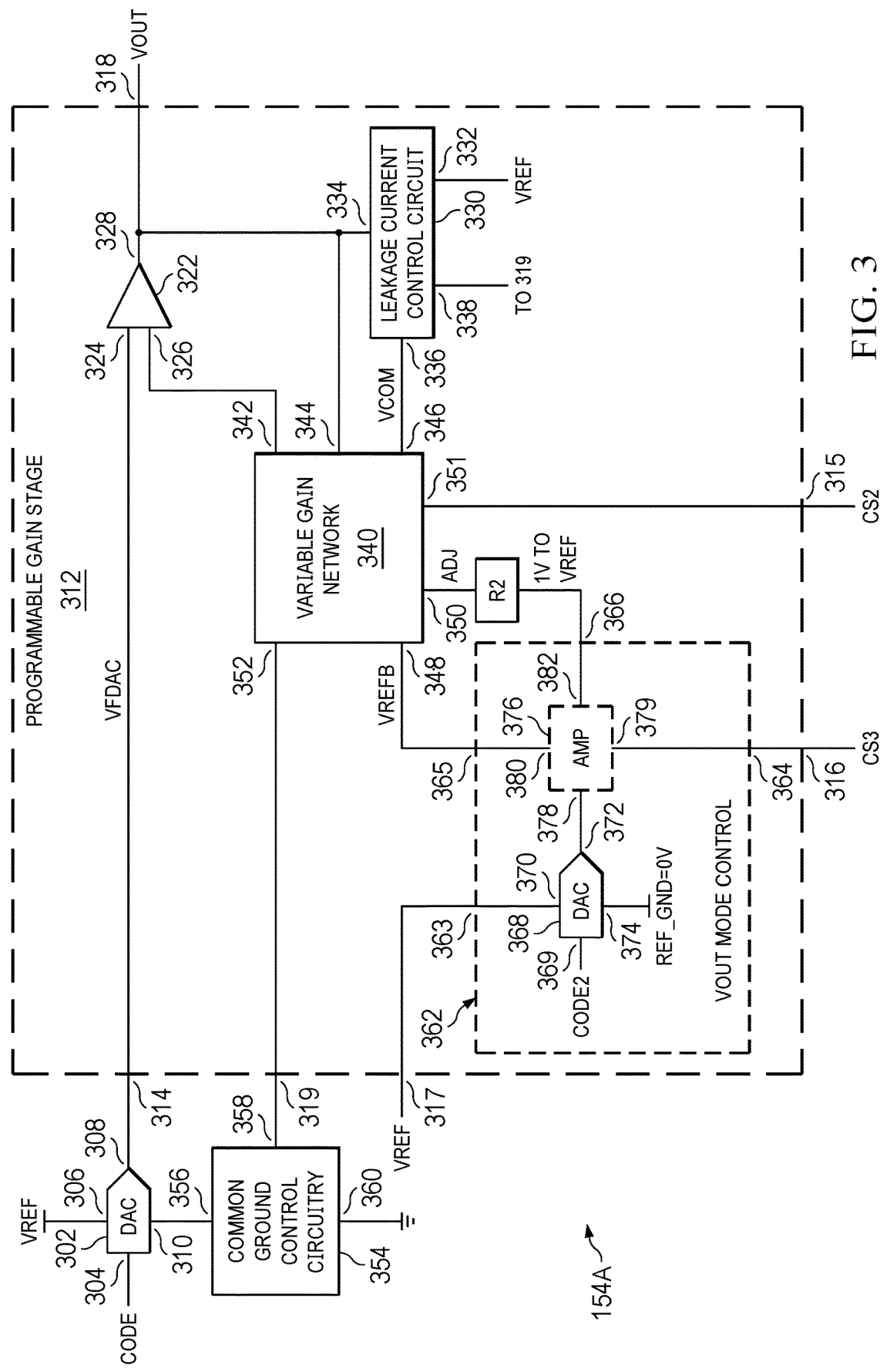
FIG. 3 is a diagram of an example digital-to-analog converter (DAC) circuit.

FIG. 3 is a diagram of an example DAC circuit 154A. The DAC circuit 154A is an example of the DAC circuit 154 in FIGS. 1 and 2. As shown, the DAC circuit 154 includes a DAC core 302, a programmable gain stage 312, and common ground control circuitry 354. The DAC core 302 has a first terminal 304, a second terminal 306, a third terminal 308, and a ground terminal 310. The programmable gain stage has a first terminal 314, a second terminal 315, a third terminal 316, a fourth terminal 317, a fifth terminal 318, and a ground terminal 319. The common ground control circuitry 354 has a first terminal 356, a second terminal 358, and a third terminal 360.

In some examples, the programmable gain stage 312 includes an operational amplifier 322, a leakage current control circuit 330, a variable gain network 340, a resistor R2, and output voltage (VOUT) mode control circuitry 362. The operational amplifier 322 has a first terminal 324, a second terminal 326, and a third terminal 328. The leakage current control circuit 330 has a first terminal 332, a second terminal 334, a third terminal 336, and a ground terminal 338. The variable gain network 340 has a first terminal 342, a second terminal 344, a third terminal 346, a fourth terminal 348, a fifth terminal 350, a sixth terminal 351, and a ground terminal 352. The resistor R2 has a first terminal and a second terminal. The VOUT mode control circuitry 362 has a first terminal 363, a second terminal 364, a third terminal 365, and a fourth terminal 366. The VOUT mode control circuitry 362 may also include a ground terminal (not shown). In some examples, the VOUT mode control circuitry 362 includes a DAC core 368 and an amplifier circuit 376. The DAC core 368 has a first terminal 369, a second terminal 370, a third terminal 372, and a ground terminal 374. The amplifier circuit 376 has a first terminal 378, a second terminal 379, a third terminal 380, and a fourth terminal 382. In some examples, the amplifier circuit 376 may include multiple stages of operational amplifiers.

In the example of FIG. 3, the first terminal 304 of the DAC core 302 receives a code. The second terminal 306 of the DAC core 302 receives VREF. The third terminal 308 of the DAC core 302 is coupled to the first terminal 314 of the programmable gain stage 312. The ground terminal 310 of the DAC core 302 is coupled to the first terminal 356 of the common ground control circuitry 354. The second terminal 358 of the common ground control circuitry 354 is coupled to the ground terminal 319 of the programmable gain stage 312. The second terminal 315 of the programmable gain stage 312 receives a control signal (CS2). The third terminal 316 of the programmable gain stage 312 receives a control signal (CS3). The fourth terminal 317 of the programmable gain stage 312 receives VREF. The fifth terminal 318 of the programmable gain stage 312 provides VOUT.

The first terminal 324 of the operational amplifier 322 is coupled to the first terminal 314 of the programmable gain stage 312. The second terminal 326 of the operational amplifier 322 is coupled to the first terminal 342 of the variable gain network 340. The third terminal 328 of the operational amplifier 322 is coupled to the fifth terminal 318 of the programmable gain stage 312.

The first terminal 332 of the leakage current control circuit 330 is coupled to the fourth terminal 317 of the programmable gain stage 312 and receives VREF. The second terminal 334 of the leakage current control circuit 330 is coupled to the third terminal 328 of the operational amplifier 322 and receives VOUT. The third terminal 336 of the leakage current control circuit 330 is coupled to third terminal 346 of the variable gain network 340 and provides VCOM. The ground terminal 338 of the leakage current control circuit 330 is coupled to the ground terminal 319 of the programmable gain stage 312.

The second terminal 344 of the variable gain network 340 is coupled to the third terminal 328 of the operational amplifier 322. The fourth terminal 348 of the variable gain network 340 is coupled to the fourth terminal 317 of the programmable gain stage 312 and receives VREF. The fifth terminal 350 of the variable gain network 340 is coupled to the second terminal of the resistor R2. The sixth terminal 351 of the variable gain network 340 is coupled to the second terminal 315 of the programmable gain stage 312 and receives CS2. The ground terminal 352 of the variable gain network 340 is coupled to the ground terminal 319 of the programmable gain stage 312.

The first terminal 363 of the VOUT mode control circuitry 362 is coupled to the fourth terminal 317 of the programmable gain stage 312 and receives VREF. The second terminal 364 of the VOUT mode control circuitry 362 is coupled to the third terminal 316 of the programmable gain stage 312 and receives CS3. The third terminal 365 of the VOUT mode control circuitry 362 is coupled to the fourth terminal 348 of the programmable gain stage 312 and receives CS3. The fourth terminal 366 of the VOUT mode control circuitry 362 is coupled to the first terminal of the resistor R2. Specifically, the first terminal 369 of the DAC core 368 receives a code (CODE2). In some examples, the DAC core 368 is a 16-bit DAC core. In such examples, CODE2 is 16-bit digital signal. The second terminal 370 of the DAC core 368 is coupled to the first terminal 363 of the VOUT mode control circuitry 362 and receives VREF. The third terminal 372 of the DAC core 368 is coupled to the first terminal 378 of the amplifier circuit 376. The ground terminal 374 of the DAC core 368 is coupled to the ground terminal 319 of the programmable gain stage 312. The second terminal 379 of the amplifier circuit 376 is coupled to the second terminal 364 of the VOUT mode control circuitry 362 and receives CS3. The third terminal 380 of the amplifier circuit 376 is coupled to the third terminal 365 of the VOUT mode control circuitry 362. The third terminal 380 of the amplifier circuit 376 is coupled to the third terminal 365 of the VOUT mode control circuitry 362. The fourth terminal 382 of the amplifier circuit 376 is coupled to the fourth terminal 366 of the VOUT mode control circuitry 362.

In the example of FIG. 3, the DAC core 302 operates to: receive a code at its first terminal 304; receive VREF at its second terminal 306; and provide an analog signal (VFDAC) at its third terminal 308 responsive to the code and VREF. In some examples, the digital input signal to the DAC core 302 is an 18-bit DAC core. In such examples, CODE is an 18-bit digital signal. The programmable gain stage 312 operates to: receive VFDAC at its first terminal 314; receive CS2 at its second terminal 315; receive CS3 at its third terminal 316; receive VREF at its fourth terminal 317; and provide VOUT at its fifth terminal 318 responsive to VFDAC, CS2, CS3, VREF, and the operations of the variable gain network 340, the leakage current control circuit 330, and the VOUT mode control circuitry 362.

Specifically, the leakage current control circuit 330 operates to: receive VREF at its first terminal 332; receive VOUT at its second terminal 334; and provide a leakage current control signal (VCOM) at its third terminal 336 responsive to VREF and VOUT. In some examples, VCOM approximates VFDAC to within a threshold tolerance. The variable gain network 340 operates to: receive VFDAC at its first terminal 342; receive VOUT at its second terminal 344; receive VCOM at its third terminal 346; receive a buffered VREF (VREFB) at its fourth terminal 348 or a buffered adjustment signal (ADJ) at its fifth terminal 350; receive CS2 at its sixth terminal 351; provide a first resistance value between its first terminal 342 and its second terminal 344; and provide a second resistance value between its first terminal 342 and its ground terminal 352 responsive to VFDAC, VOUT, VCOM, VREFB or ADJ, and CS2.

The VOUT mode control circuitry 362 operates to: receive VREF at its first terminal 363; receive CS3 at its second terminal 364; provide VREFB at its third terminal 365 responsive to VREF and CS3; or provide a buffered control voltage (e.g., 1V to VREF) at its fourth terminal 366 responsive to VREF and CS3. Specifically, the DAC core 368 of the VOUT mode control circuitry 362 operates to: receive CODE2 at its first terminal 369; receive VREF at its second terminal 370; and provide an analog signal at its third terminal 372 responsive to the digital input signal and VREF. The amplifier circuit 376 of the VOUT mode control circuitry 362 operates to: receive an analog signal from the DAC core 368 at its first terminal 378; receive CS3 at its second terminal 379; provide VREFB at its third terminal 380 responsive to the analog signal from the DAC core 368 and CS3; or provide the control voltage (e.g., 1V to VREF) at its fourth terminal 382 responsive to the analog signal from the DAC core 368 and CS3. R2 operates to adjust the buffered control voltage (e.g., 1V to VREF), resulting in ADJ for use by the variable gain network 340.

There are three types of VOUT available from the programmable gain stage 312: bipolar, unipolar, and asymmetric. When the desired VOUT is either bipolar or unipolar, the VOUT mode control circuitry 362 operates to provides VREFB to the variable gain network 340 responsive to VREF and CS3. When the desired VOUT is asymmetric, the VOUT mode control circuitry 362 operates to provide the control voltage (e.g., 1 V to VREF) so that ADJ is provided to the variable gain network 340 responsive to VREF and CS3.

The common ground control circuitry 354 operates to: receive a first ground current from the DAC core 302 at its first terminal 356; receive a second ground current from the programmable gain stage 312 at its second terminal 358; provide a first impedance between the first terminal 356 and the third terminal 360; and provide a second impedance between the second terminal 358 and the third terminal 360. In some examples, the common ground control circuitry 354 maintains the ground current from the DAC core 302 stable using a ground buffer or a compensation circuit to account for ground current variance from the programmable gain stage 312.

Figure 4:
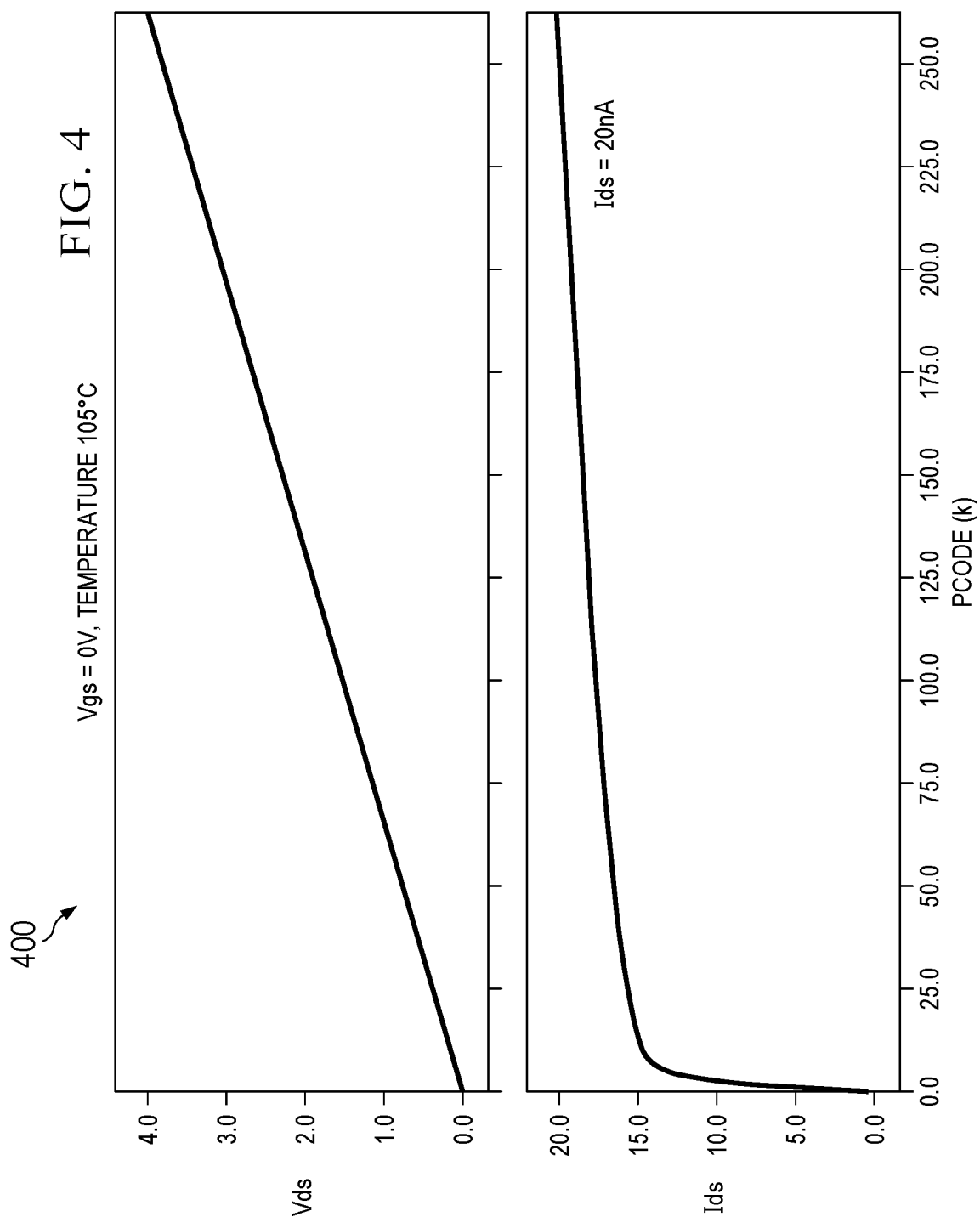
FIG. 4 is a graph showing drain-to-source voltage (VDS) and drain-to-source current (Ids) of an example transistor as a function of digital input code.

FIG. 4 is a graph 400 showing drain-to-source voltage (Vds) and drain-to-source current (Ids) of an example transistor as a function of code. In FIG. 4, the example transistor is an n-channel metal-oxide semiconductor (NMOS) transistor, Ids corresponds to leakage current, a gate-to-source voltage (Vgs) of 0 is assumed, and a temperature of 105° C. is assumed. As shown in graph 400, as Vds increases linearly from 0V to 4V, Ids increases sharply initially, and then flattens to a value of about 20 nA. Such leakage current is undesirable and affect VOUT accuracy of a DAC circuit such as the DAC circuit 154 in FIGS. 1 and 2, or the DAC circuit 154A in FIG. 3.

Figure 5:
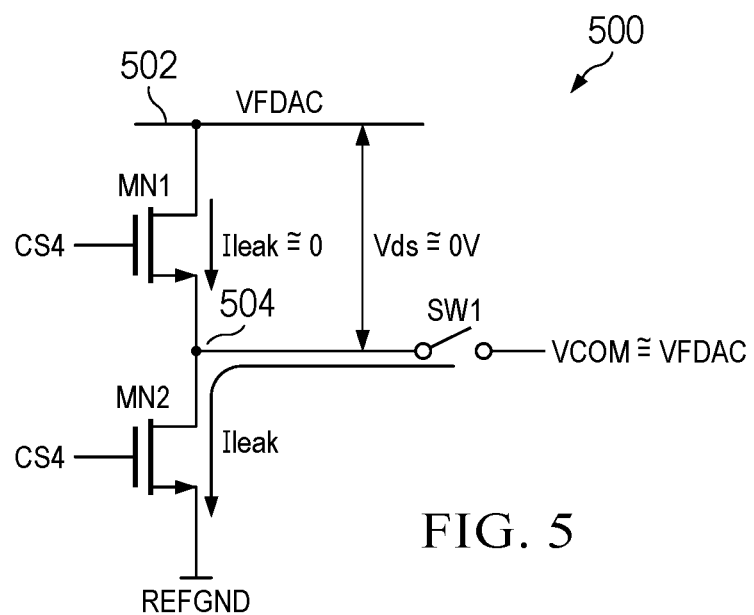
FIG. 5 is a schematic diagram of an example gain-selection circuit with leakage current reduction.

FIG. 5 is a schematic diagram of an example gain-selection circuit 500 with leakage current reduction. In the example of FIG. 5, the gain-selection circuit 500 includes two NMOS transistors MN1 and MN2 in series between a VFDAC node 502 and a ground terminal (REFGND). Relating FIG. 5 to FIG. 3, REFGND may be the ground terminal 319 of the programmable gain stage 312 in FIG. 3. In the example of FIG. 5, each of the transistors MN1 and MN2 includes a first terminal, a second terminal, and a control terminal. The first terminal of MN1 is coupled to the VFDAC node 502. The second terminal of MN1 is coupled to the first terminal of MN2. The second terminal of MN2 is coupled to the ground terminal. The control terminals of MN1 and MN2 receive the same control signal (CS4). By applying VCOM (approximately equal to VFDAC) to the node 504 between the second terminal of MN1 and the first terminal of MN2, Vds is approximately 0 and thus leakage current through MN1 is avoided. While there is still leakage current through MN2 when VCOM is provided, this leakage current will not affect the VOUT accuracy. In some examples, the gain-selection circuit 500 includes a switch SW1 to control when VCOM is provided to node 504. In operation, the switch SW1 is closed when the transistors MN1 and MN2 are turned on (CS4 high). The switch SW1 is open when MN1 and MN2 are turned off (CS4 low). In some examples, the gain-selection circuit 500 is used within a variable gain network, such as the variable gain network 340 of FIG. 3, to support variable gain selection with reduced leakage current issues and thus improved accuracy.

Figure 6:
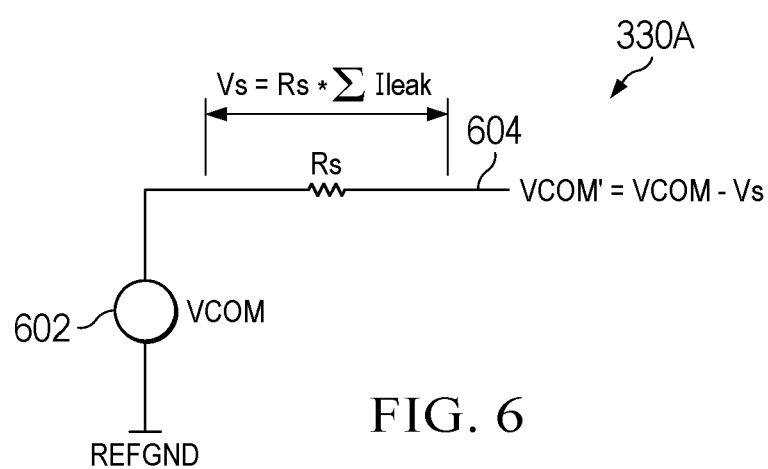
FIG. 6 is a schematic diagram of an example leakage current control circuit.

FIG. 6 is a schematic diagram of an example leakage current control circuit 330A. The leakage current control circuit 330A is a model for the leakage current control circuit 330 of FIG. 3. As shown, the leakage current control circuit 330A includes a voltage source 602 in series with a resistor Rs. The voltage source 602 operates to provide VCOM. After a voltage drop through Rs, the voltage at the node 604 is VCOM'=VCOM−Vs. In the example of FIG. 6, Vs=Rs*ΣIleak, where Ileak is the leakage current. leakage current control circuit 330A. In some examples, leakage current control circuit 330A is achieved using a replica network to provide VCOM, where VCOM approximates VFDAC. As used herein, a replica network refers to a circuit to obtain an accurate replica of an active electrical parameter (e.g., a voltage such as VFDAC). In some examples, the replica voltage may be scaled-down version of VFDAC. In some examples, the replica network is based on the topology of another circuit, such as the variable gain network 340. As an alternative option, VCOM could be generated using a replica DAC. The replica DAC would receive the same code, the same VREF, and would have the same ground (e.g., REFGND) as the DAC core 302. As used herein, a replica DAC refers to a DAC circuit to obtain an accurate replica of an active electrical parameter (e.g., an output voltage such as VFDAC) of another DAC. In some examples, the replica DAC provides a replica VFDAC to within a target tolerance of VFDAC from the DAC core 302.

Figure 7:
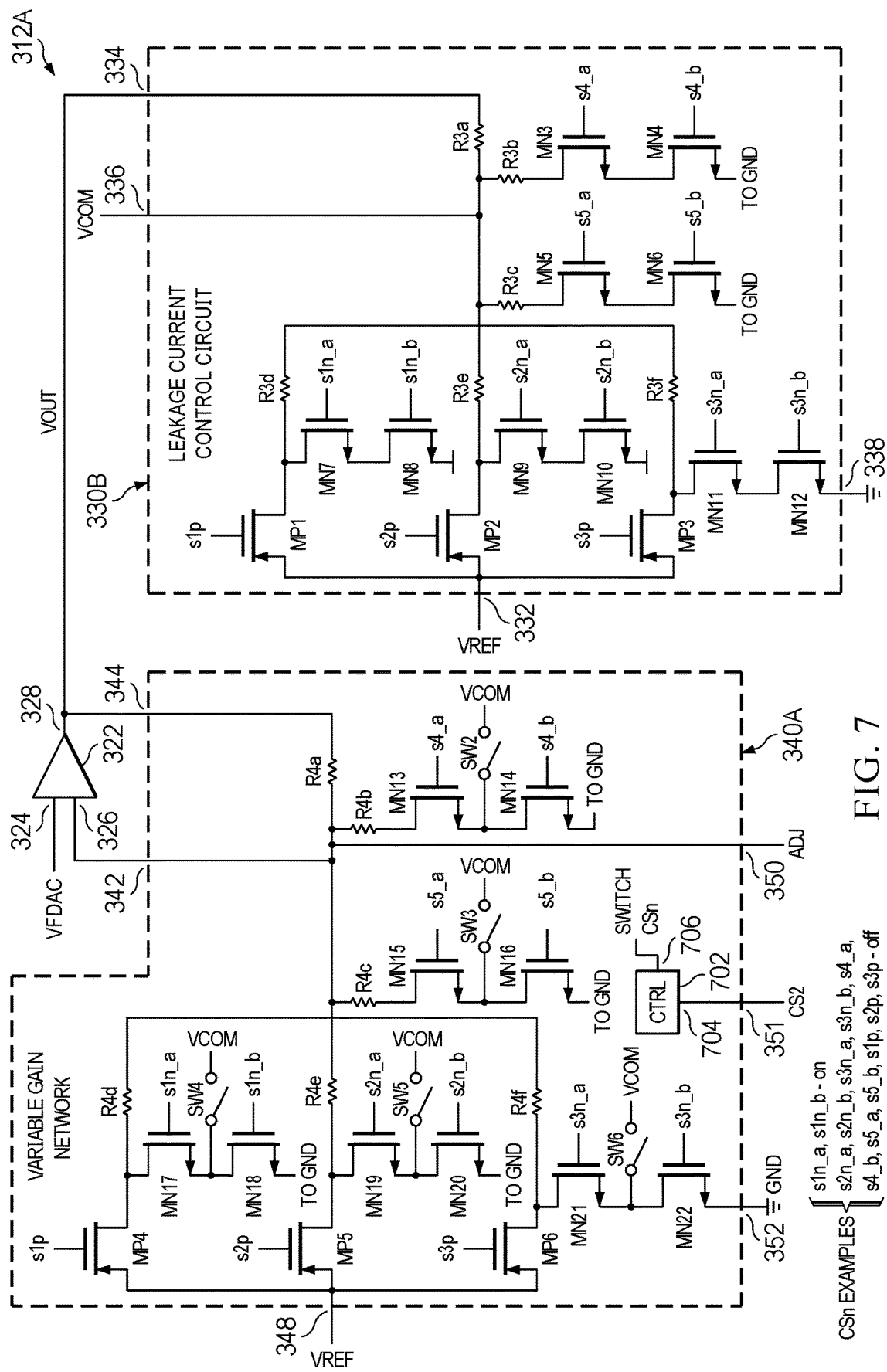
FIG. 7 is a schematic diagram of an example programmable gain stage for a DAC circuit.

FIG. 7 is a schematic diagram of an example programmable gain stage 312A for a DAC circuit such as the DAC circuit 154 in FIGS. 1 and 2, or the DAC circuit 154A in FIG. 3. The programmable gain stage 312A in FIG. 7 is an example of the programmable gain stage 312 in FIG. 3. As shown, the programmable gain stage 312A includes the operational amplifier 322, a leakage current control circuit 330B, and a variable gain network 340A. The leakage current control circuit 330B is an example of the leakage current control circuit 330 of FIG. 3, or the leakage current control circuit 330A in FIG. 6. The variable gain network 340A is an example of the variable gain network 340 in FIG. 3.

In the example of FIG. 7, the leakage current control circuit 330B includes resistors R3a to R3f, transistors MN3 to MN12, and transistors MP1 to MP3 in the arrangement shown. Each of the resistors R3a to R3f has respective first and second terminals. The transistors MN3 to MN12 are NMOS transistors. Each of the transistors MN3 to MN12 has a respective first terminal, a respective second terminal, and a respective control terminal. The transistors MP1 to MP3 are p-channel metal-oxide semiconductor (PMOS) transistors. Each of the transistors MP1 to MP3 has a respective first terminal, a respective second terminal, and a respective control terminal.

The variable gain network 340A includes resistors R4a to R4f, transistors MN13 to MN22, transistors MP4 to MP6, switches SW2 to SW6, and a controller 702 in the arrangement shown. Each of the resistors R4a to R4f has respective first and second terminals. The transistors MN13 to MN22 are NMOS transistors. Each of the transistors MN13 to MN22 has a respective first terminal, a respective second terminal, and a respective control terminal. The transistors MP4 to MP6 are PMOS transistors. Each of the transistors MP4 to MP6 has a respective first terminal, a respective second terminal, and a respective control terminal. Each of the switches SW2 to SW6 may be complementary metal-oxide semiconductor (CMOS) transistors (i.e., an NMOS transistor and a PMOS transistor in parallel). The controller 702 has a first terminal 704 and second terminals 706.

In some examples, the resistors R3a to R3f each have a first resistance value, and the resistors R4a to R4f each have a second resistance value. To reduce power consumption of the leakage current control circuit 330B, the first resistance value may be greater than the second resistance value. In one example, the first resistance value is 150KΩ and the second resistance value is 30KΩ. In some examples, each of the transistors MN3 to MN12 has a first size, each of the transistors MN13 to MN22 has a second size, each of the transistors MP1 to MP3 has a third size, and each of the transistors MP4 to MP6 has a fourth size. Relative to the first size of each of the transistors MN3 to MN12, the second size of each of the transistors MN13 to MN22 is larger (e.g., the second size is 5× larger than the first size). Relative to the third size of each of the transistors MP1 to MP3, the fourth size of each of the transistors MP4 to MP6 is larger (e.g., the fourth size is 5× larger than the third size).

In the example of FIG. 7, the first terminal of the resistor R3a is coupled to the second terminal 334 of the leakage current control circuit 330B and receives VOUT. The second terminal of the resistor R3a is coupled to the third terminal 336 of the leakage current control circuit 330B and provides VCOM. The second terminal of the resistor R3a is also coupled to the respective first terminals of the resistors R3b, R3c, R3d, R3e, and R3f. The second terminal of the resistor R3b is coupled to the first terminal of the transistor MN3.

As shown, the second terminal of the transistor MN3 is coupled to the first terminal of the transistor MN4. The second terminal of the transistor MN4 is coupled to the ground terminal 338 of the leakage current control circuit 330B. The second terminal of the resistor R3c is coupled to the first terminal of the transistor MN5. The second terminal of the transistor MN5 is coupled to the first terminal of the transistor MN6. The second terminal of the transistor MN6 is coupled to the ground terminal 338 of the leakage current control circuit 330B.

As shown, the second terminal of the resistor R3d is coupled to the first terminal of the transistor MP1. The second terminal of the transistor MP1 is coupled to the first terminal 332 of the leakage current control circuit 330B and receives VREF. The second terminal of the resistor R3d is also coupled to the first terminal of the transistor MN7. The second terminal of the transistor MN7 is coupled to the first terminal of the transistor MN8. The second terminal of the transistor MN8 is coupled to the ground terminal 338 of the leakage current control circuit 330B.

As shown, the second terminal of the resistor R3e is coupled to the first terminal of the transistor MP2. The second terminal of the transistor MP2 is coupled to the first terminal 332 of the leakage current control circuit 330B and receives VREF. The second terminal of the resistor R3e is also coupled to the first terminal of the transistor MN9. The second terminal of the transistor MN9 is coupled to the first terminal of the transistor MN10. The second terminal of the transistor MN10 is coupled to the ground terminal 338 of the leakage current control circuit 330B.

As shown, the second terminal of the resistor R3f is coupled to the first terminal of the transistor MP3. The second terminal of the transistor MP3 is coupled to the first terminal 332 of the leakage current control circuit 330B and receives VREF. The second terminal of the resistor R3f is also coupled to the first terminal of the transistor MN11. The second terminal of the transistor MN11 is coupled to the first terminal of the transistor MN12. The second terminal of the transistor MN12 is coupled to the ground terminal 338 of the leakage current control circuit 330B.

As shown, the first terminal of the resistor R4a is coupled to the second terminal 344 of the variable gain network 340A and receives VOUT. The second terminal of the resistor R4a is coupled to the first terminal 342 of the variable gain network 340A. The second terminal of the resistor R4a is also coupled to the fifth terminal 350 of the variable gain network 340A and receives ADJ. The second terminal of the resistor R4a is also coupled to the respective first terminals of the resistors R4b, R4c, R4d, R4e, and R4f. The second terminal of the resistor R4b is coupled to the first terminal of the transistor MN13.

As shown, the second terminal of the transistor MN13 is coupled to the first terminal of the transistor MN14. The second terminal of the transistor MN14 is coupled to the ground terminal 352 of the variable gain network 340A. The second terminal of the resistor R4c is coupled to the first terminal of the transistor MN15. The second terminal of the transistor MN15 is coupled to the first terminal of the transistor MN16. The second terminal of the transistor MN16 is coupled to the ground terminal 352 of the variable gain network 340A. The second terminal of the resistor R4d is coupled to the first terminal of the transistor MP4. The second terminal of the transistor MP4 is coupled to the fourth terminal 348 of the variable gain network 340A and receives VREF. The second terminal of the resistor R4d is also coupled to the first terminal of the transistor MN17.

As shown, the second terminal of the transistor MN17 is coupled to the first terminal of the transistor MN18. The second terminal of the transistor MN18 is coupled to the ground terminal 352 of the variable gain network 340A. The second terminal of the resistor R4e is coupled to the first terminal of the transistor MP5. The second terminal of the transistor MP5 is coupled to the fourth terminal 348 of the variable gain network 340A and receives VREF. The second terminal of the resistor R4e is also coupled to the first terminal of the transistor MN19.

As shown, the second terminal of the transistor MN19 is coupled to the first terminal of the transistor MN20. The second terminal of the transistor MN20 is coupled to the ground terminal 352 of the variable gain network 340A. The second terminal of the resistor R4f is coupled to the first terminal of the transistor MP6. The second terminal of the transistor MP6 is coupled to the fourth terminal 348 of the variable gain network 340A and receives VREF. The second terminal of the resistor R4f is also coupled to the first terminal of the transistor MN21. The second terminal of the transistor MN21 is coupled to the first terminal of the transistor MN22. The second terminal of the transistor MN22 is coupled to the ground terminal 352 of the variable gain network 340A.

In the example of FIG. 7, the first terminal of the switch SW2 is coupled to the third terminal 346 of the variable gain network 340A and receives VCOM. The second terminal of the switch SW2 is coupled to second terminal of MN13 and the first terminal of MN14. The first terminal of the switch SW3 is coupled to the third terminal 346 of the variable gain network 340A and receives VCOM. The second terminal of the switch SW3 is coupled to second terminal of MN15 and the first terminal of MN16. The first terminal of the switch SW4 is coupled to the third terminal 346 of the variable gain network 340A and receives VCOM. The second terminal of the switch SW4 is coupled to second terminal of MN17 and the first terminal of MN18. The first terminal of the switch SW5 is coupled to the third terminal 346 of the variable gain network 340A and receives VCOM. The second terminal of the switch SW5 is coupled to second terminal of MN19 and the first terminal of MN20. The first terminal of the switch SW6 is coupled to the third terminal 346 of the variable gain network 340A and receives VCOM. The second terminal of the switch SW6 is coupled to second terminal of MN21 and the first terminal of MN22.

The first terminal 704 of the controller 702 is coupled to the sixth terminal 351 of the variable gain network 340A and receives CS2. The second terminals 706 of the controller 702 are coupled to the respective control terminals of the transistors MN13 to MN22, the transistors MP4 to MP6, and the switches SW2 to SW6 and provide respective control signals CSn. In the example of FIG. 7, the control signals CSn include sin_a, sin_b, s2n_a, s2n_b, s3n_a, s3n_b, s4n_a, s4n_b, s5n_a, s5n_b, s1p, s2p, and s3p. As shown, the control signals for the transistors MN13 to MN22 of the variable gain network 340A are also used for the transistors MN3 to MN12 of the leakage current control circuit 330B. Also, the control signals for the transistors MP4 to MP6 of the variable gain network 340A are also used for the transistors MP1 to MP3 of the leakage current control circuit 330B. The control signals CSn also includes control signals for the switches SW2 to SW6 (not specifically shown).

In some examples, the control signals CSn are selected based on CS2 to provide a target gain for the variable gain network 340A. ADJ is provided to adjust a range or mode of the variable gain network 340A. Example modes include a unipolar mode, a bipolar mode, and an asymmetric mode. The unipolar mode provides a VOUT with a range from 0V to +TV, where +TV is a target positive voltage. The bipolar mode provides a VOUT with a range from -TV2 to +TV2, where -TV2 is a target negative voltage and +TV2 is a target positive voltage equal in magnitude to -TV2. The asymmetric mode provides a VOUT with a range from -TV3 to +TV3, where -TV3 is a target negative voltage and +TV3 is a target positive voltage that is not equal in magnitude to -TV3.

The leakage current control circuit 330A operates to: receive VREF at its first terminal 332; receive VOUT at its second terminal 334; and provide VCOM at its third terminal 336 responsive to VREF, VOUT, the resistors R3a to R3f, the transistors MN3 to MN12 and related control signals, and the transistors MP1 to MP3 and related control signal. In some examples, VCOM approximates VFDAC, which is the voltage at the first terminal 342 of the variable gain network 340A.

The variable gain network 340A operates to: receive VFDAC at its first terminal 342; receive VOUT at its second terminal 344; receive VCOM at its third terminal 346; receive VREF at its fourth terminal 348; receive ADJ at its fifth terminal 350; receive CS2 at its sixth terminal; provide a first resistance value between its first terminal 342 and its second terminal 344 based on resistor R4a; and provide a second resistance value between its first terminal 342 and its ground terminal 352 responsive to VFDAC, VOUT, VCOM, VREF, ADJ, CS2, the resistors R4b to R4f, the transistors MN13 to MN22 and related control signals, the transistors MP4 to MP5 and related control signals, and the switches SW2 to SW6 and related control signals. Without limitation, the variable gain network 340A and VOUT mode control circuitry, such as the VOUT mode control circuitry 362 in FIG. 3, may support gains of 2, 4, and 6 in a unipolar mode or a bipolar mode, and gains of 6 and 9 in an asymmetric mode. In the example of FIG. 7, an example gain of 2 with a unipolar VOUT mode is achieved based on: sin_a and sin_b on or asserted; and s2n_a, s2n_b, s3n_a, s3n_b, s4_a, s4_b, s5_a, s5_b, s1p, s2p, s3p off or de-asserted.

Figure 8A:
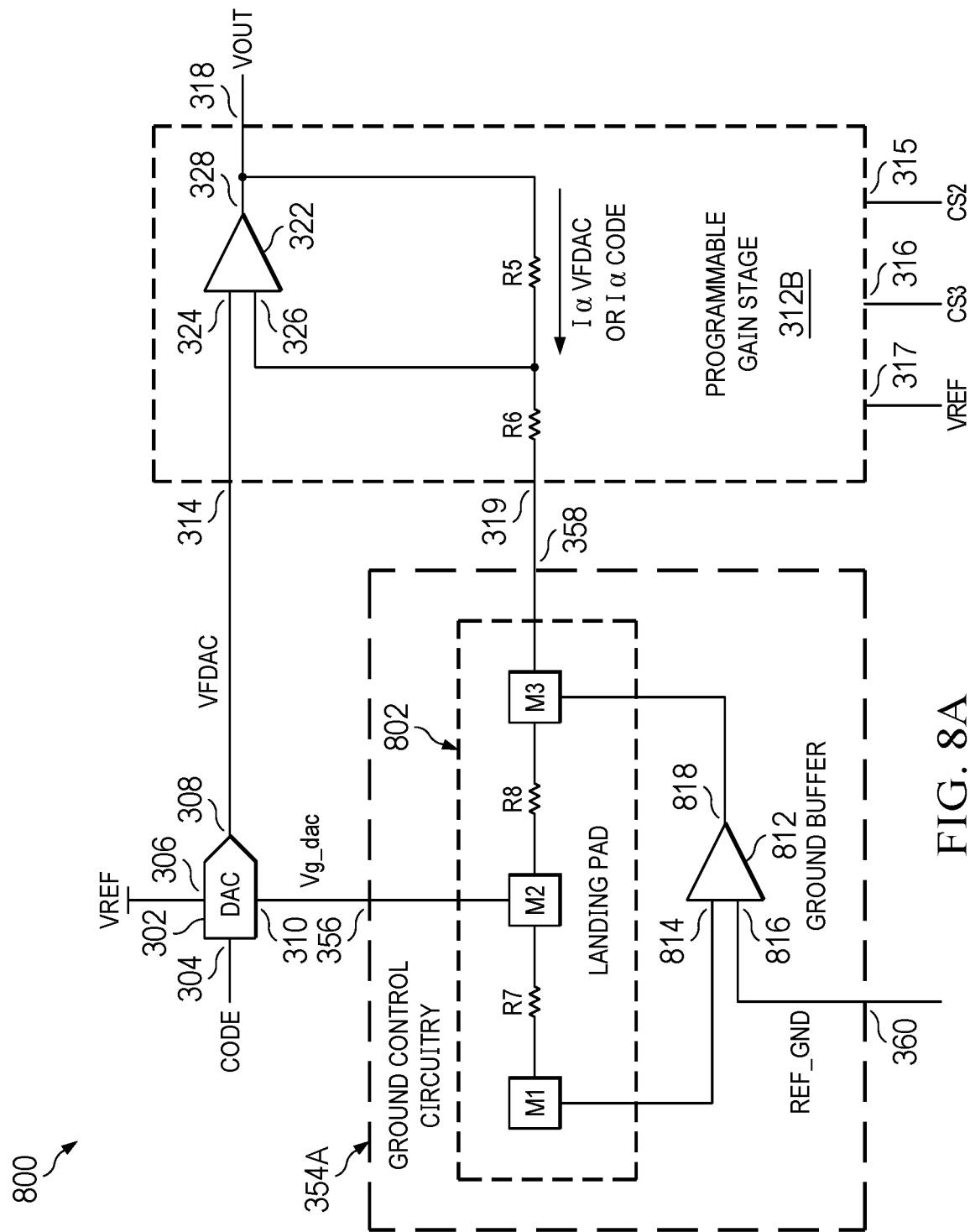
FIG. 8A is a schematic diagram of another example DAC circuit.

FIG. 8A is a schematic diagram of another example DAC circuit 800. As shown, the DAC circuit 800 includes the DAC core 302, a programmable gain stage 312B, and common ground control circuitry 354A. The programmable gain stage 312B is a simple representation of the programmable gain stage 312 in FIG. 3, or the programmable gain stage 312A in FIG. 7 after programming is complete. The common ground control circuitry 354A is an example of the common ground control circuitry 354 in FIG. 3.

In the example of FIG. 8A, the programmable gain stage 312B includes the operational amplifier 322 and resistors R5 and R6. In some examples, the values of the resistors R5 and R6 may be selected using a variable gain network, such as the variable gain network 340 in FIG. 3, or the variable gain network 340A in FIG. 7. In other words, the resistor R5 is an example of the first resistance value (e.g., R4a) of the variable gain network 340A in FIG. 7. The resistor R6 is an example of the second resistance value of the variable gain network 340A in FIG. 7, where the value of the resistor R6 is a function of CS2, CS3, VOUT, and VREF.

As shown, the first terminal 356 of the common ground control circuitry 354A is coupled to the ground terminal 310 of the DAC core 302. The second terminal 358 of the common ground control circuitry 354A is coupled to the ground terminal 319 of the programmable gain stage 312B. The third terminal 360 of the common ground control circuitry 354A is coupled to ground. In some examples, the common ground control circuitry 354A includes a landing pad 802 and a ground buffer 812. The landing pad 802 includes a first metal layer M1, a second metal layer M2, and a third metal layer M3. Between the first metal layer M1 and the second metal layer M2 is a resistor R7. Between the second metal layer M2 and the third metal layer M3 is a resistor R8. In some examples, the resistors R7 and R8 are metal resistors, such as via resistors. As shown, the ground buffer 812 has a first terminal 814, a second terminal 816, and a third terminal 818.

In the example of FIG. 8A, the first terminal 356 of the common ground control circuitry 354A is coupled to the ground terminal 310 of the DAC core 302. The second terminal 358 of the common ground control circuitry 354A is coupled to the ground terminal 319 of the programmable gain stage 312B. The metal layer M2 of the landing pad 802 is coupled to the first terminal 356 of the common ground control circuitry 354A. The metal layer M3 of the landing pad 802 is coupled to the second terminal 358 of the common ground control circuitry 354A. The metal layer M1 of the landing pad 802 is coupled to the first terminal 814 of the ground buffer 812. The second terminal 816 of the ground buffer 812 is coupled to the third terminal 360 of the common ground control circuitry 354A. The third terminal 818 of the ground buffer 812 is coupled to the metal layer M3 of the landing pad 802.

The common ground control circuitry 354A operates to: receive a first ground current from the DAC core 302 at its first terminal 356; receive a second ground current from the programmable gain stage 312B at its second terminal 358; provide a first impedance between the first terminal 356 and the third terminal 360; and provide a second impedance between the second terminal 358 and the third terminal 360. More specifically, the landing pad 802 contributes to the first impedance using the resistor R7 and contributes to the second impedance using the resistor R8. The first impedance is also a function of the impedance between the first terminal 814 and the second terminal 816 of the ground buffer 812. The second impedance is also a function of the impedance between the third terminal 818 and the second terminal 816 of the ground buffer 812.

Figure 8B:
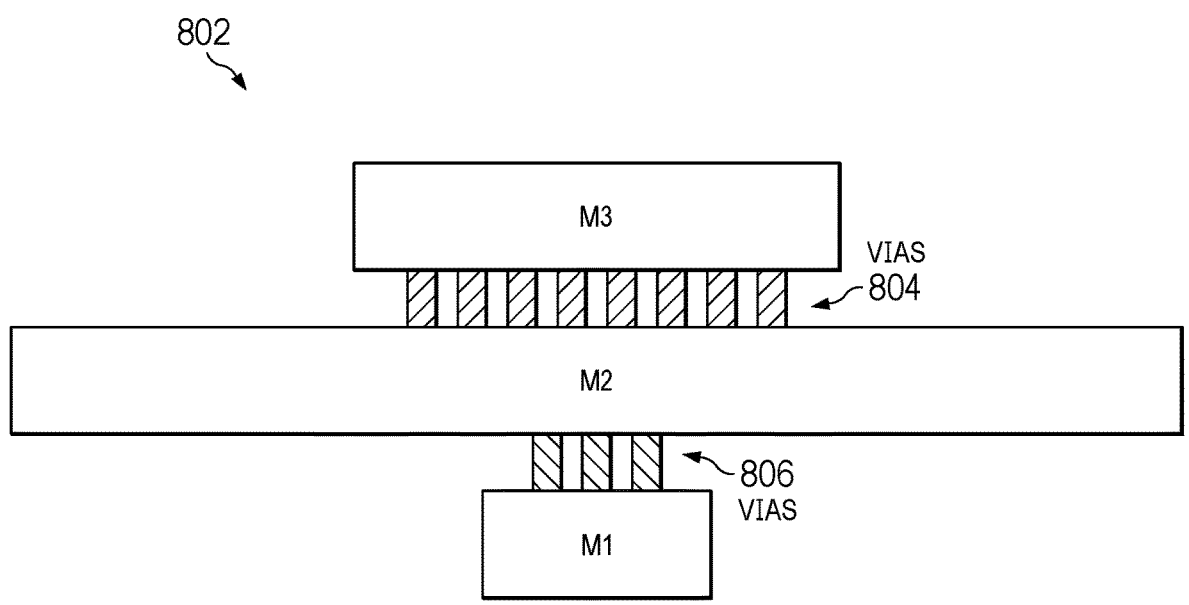
FIG. 8B is a cross-sectional view of the landing pad for the DAC circuit of FIG. 8A.

FIG. 8B is a cross-sectional view of the landing pad 802 for the DAC circuit 800 of FIG. 8A. In the example of FIG. 8B, the metal layer M1 is below the metal layer M2, and the metal layer M3 is above the metal layer M2. Between the metal layer M1 and the metal Layer M2 are metal vias 806 that provide the target resistance for resistor R7. Between the metal layer M2 and the metal layer M3 are metal vias 804 that provide the target resistance for resistor R8. In different examples, the relative dimensions and/or the orientation of the metal layers M1, M2, and M3 may vary depending on the physical layout of the DAC circuit 800.

In some examples, the landing pad 802 may be a square-shaped metal stack where the ground lines are star connected. The sense/feedback line (the first terminal 814) of the ground buffer 812 is coupled to the metal layer M1 of the landing pad 802. The ground terminal 310 of the DAC core 302 is coupled to the metal layer M2 of the landing pad 802. The ground terminal 319 of the programmable gain stage 312B is coupled to the metal layer M3 of the landing pad 802. In some examples, the resistors R7 and R8 are equivalent routing resistances between the metal stacks. With the arrangement of FIG. 8A, code dependent current coming from the programmable gain stage 312B flows through the metal layer M3 into the third terminal 818 of the ground buffer 812. This current does not affect Vg_dac (the ground voltage at the ground terminal 310 of the DAC core 302) and thus any potential INL degradation is avoided. In some examples, the metal layer M1 is tapped into the metal layer M2 at the center to provide best virtual ground effect to Vg_dac. The ground current from the DAC core 302 flows through R8 generating a voltage error at the metal layer M3. However, this only produces an offset at VOUT which can be calibrated.

Figure 9A:
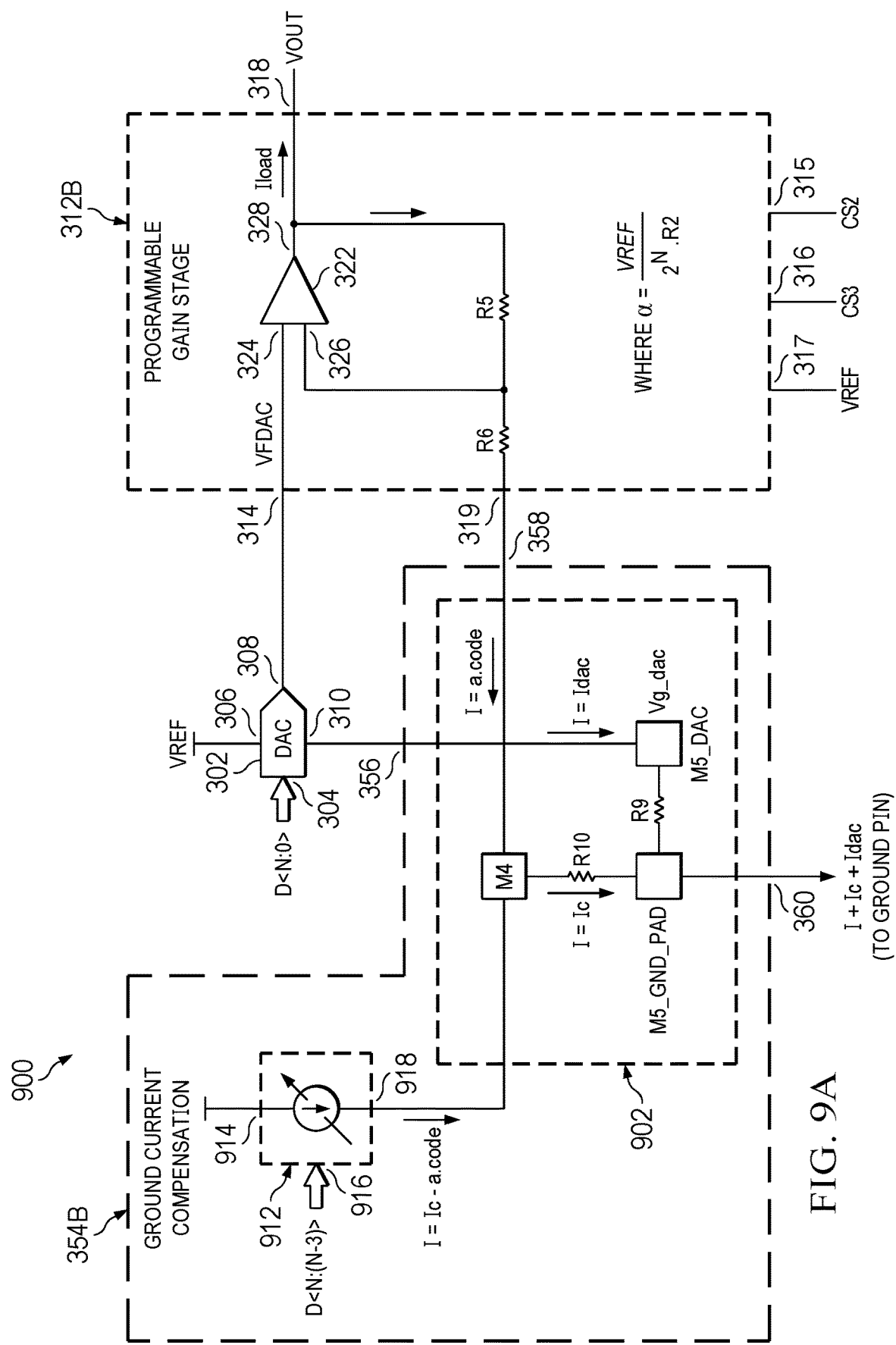
FIG. 9A is a schematic diagram of another example DAC circuit.

FIG. 9A is a schematic diagram of another example DAC circuit 900. As shown, the DAC circuit 900 includes the DAC core 302, the programmable gain stage 312B, and common ground control circuitry 354B. Again, the programmable gain stage 312B is a simple representation of the programmable gain stage 312 in FIG. 3, or the programmable gain stage 312A in FIG. 7 after programming is complete. The common ground control circuitry 354B is an example of the common ground control circuitry 354 in FIG. 3.

In the example of FIG. 9A, the description given for the programmable gain stage 312B in FIG. 8A applies. As shown, the first terminal 356 of the common ground control circuitry 354B is coupled to the ground terminal 310 of the DAC core 302. The second terminal 358 of the common ground control circuitry 354B is coupled to the ground terminal 319 of the programmable gain stage 312B. The third terminal 360 of the common ground control circuitry 354B is coupled to ground.

In some examples, the common ground control circuitry 354B includes a landing pad 902 and a ground current compensation circuit 912. The landing pad 902 includes metal layer ground pad (M5_GND_PAD), a metal layer DAC pad (M5_DAC), and another metal layer M4. Between the metal layer M5_DAC and the metal layer M5_GND_PAD is a resistor R9. Between the metal layer M4 and the metal layer M5_GND_PAD is a resistor R10. As shown, the ground current compensation circuit 912 has a first terminal 914, a second terminal 916, and a third terminal 918.

The metal layer M5_DAC of the landing pad 902 is coupled to the first terminal 356 of the common ground control circuitry 354B. The metal layer M4 of the landing pad 902 is coupled to the second terminal 358 of the common ground control circuitry 354B. The metal layer M5_GND_PAD of the landing pad 802 is coupled to the third terminal 360 of the common ground control circuitry 354B. The first terminal 914 of the ground current compensation circuit 912 receives a power supply voltage. The second terminal 916 of the ground current compensation circuit 912 receives a code (e.g., the 3 MSB of D, labeled as "D<N: (N−3)" in FIG. 9A). The third terminal 918 of the ground current compensation circuit 912 is coupled to the metal layer M4 of the landing pad 902.

The common ground control circuitry 354B operates to: receive a first ground current from the DAC core 302 at its first terminal 356; receive a second ground current from the programmable gain stage 312B at its second terminal 358; provide a first impedance between the first terminal 356 and the third terminal 360; and provide a second impedance between the second terminal 358 and the third terminal 360. More specifically, the landing pad 902 contributes to the first impedance using the resistor R9 and contributes to the second impedance using the resistor R10.

In the example of FIG. 9A, a ground buffer is avoided. Instead, the ground current compensation circuit 912 operates to inject a current to the metal layer M4 of the landing pad 902 to cancel out the ground current from the programmable gain stage 312B. In some examples, a low-resolution current DAC is used to generate the injected current. As a result, the injected current and the ground current from the programmable gain stage 312B are a function of the code (D<N:0>) and cancel each other out. The total current going to M5_GND_PAD is DAC's ground current (Idac)+the ground compensation current (Ic−a.code)+the programmable gain stage current (a.code), resulting in a total current of Ic+Idac. As a result, the total ground current to the third terminal 360 of the common ground control circuitry 354B is fairly constant or code-independent.

In some examples, the current DAC for the ground current compensation circuit 912 only uses the 3 or 4 most significant bits (MSBs) of the code <N:0> to generate the injected current. That is enough to reduce the INL error of an 18-bit DAC to acceptable limits using a low area solution. In some examples, the common ground control circuitry 354B is used with single channel products or low-voltage (e.g., below 5.5V) multichannel products where the die area is small and the routing distance between the DAC core 302 and the programmable gain stage 312B and an input/output ring (IORING) with IO pads is below a threshold. Asa another option, products in a ball-grid array (BGA) or flip-chip ball-grid array (FCBGA) package can avoid using a ground buffer by placing the ground pad very close to the DAC core 302 and programmable gain stage 312B.

In an example, the ground current compensation current cannot be picked up from the output stage of the programmable gain-stage (for example, the output of the operational amplifier 322). This is because the output stage carries the load current in addition to the code dependent ground current. In some examples, the target package size is 16×16 mm FCBGA having 144 pins. Given the large number of functional pins per channel, only one REF_GND (signal ground) may be available for the whole chip. Also, in the final system, a large number of PMUs may be packed closely on a PCB, increasing the difficulty of adding external amplifiers to drive VREF and REFGND. Accordingly, VREF and REFGND may be high impedance.

Figure 9B:
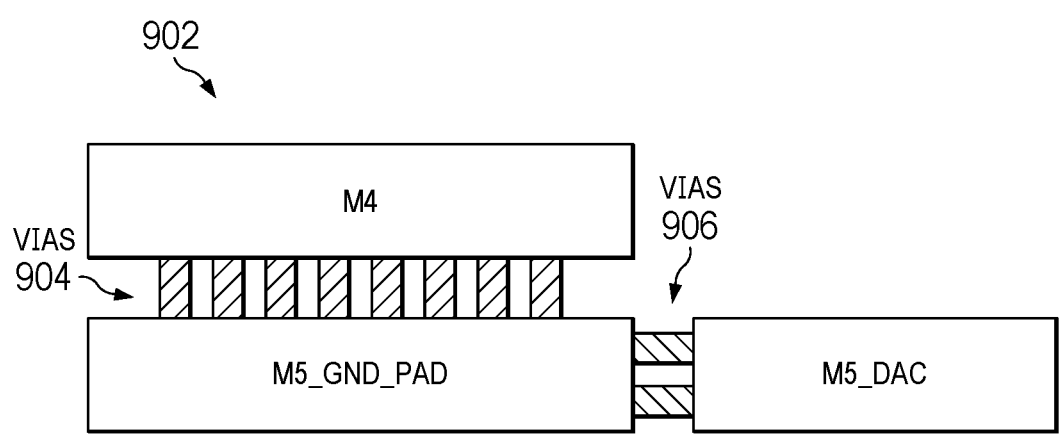
FIG. 9B is a cross-sectional view of the landing pad for the DAC circuit of FIG. 9A.

FIG. 9B is a cross-sectional view of the landing pad 902 for the DAC circuit 900 of FIG. 9A. In the example of FIG. 9B, the metal layer M4 is above the metal layers M5_GNG_PAD and M5_DAC. In some examples, the metal layers M5_GNG_PAD and M5_DAC may be formed as one metal layer before etching or another metal removal technique is applied separate the metal layers M5_GNG_PAD and M5_DAC. Between metal layer M4 and the metal layer M5_GND_PAD are metal vias 904 that provide the target resistance for resistor R10. Between the metal layer M5_GND_PAD and the metal M5_DAC are metal vias 906 that provide the target resistance for resistor R9. In different examples, the relative dimensions and/or orientation of the metal layers the metal layers M4, M5_GNG_PAD and M5_DAC may vary depending on the physical layout of the DAC circuit 900.

Figure 10:
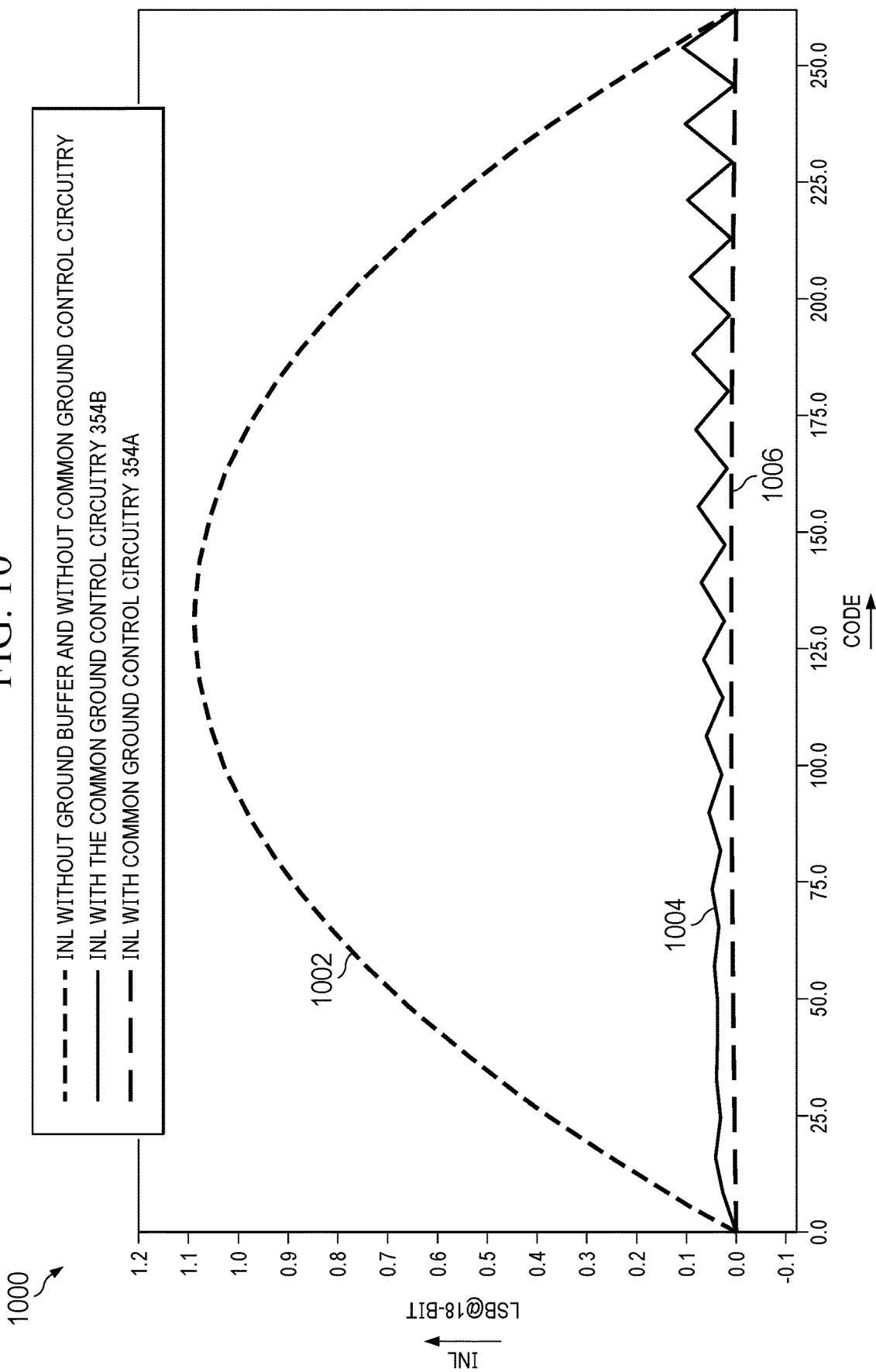
FIG. 10 is a graph of integral non-linearity (INL) as a function of code for different DAC circuits.

FIG. 10 is a graph 1000 of INL as a function of the code for different DAC circuits. In graph 1000, the INL 1002 without a ground buffer and without common ground control circuitry (e.g., the common ground control circuitry 354A in FIG. 8A, or the common ground control circuitry 354B in FIG. 9) varies as a function of code and increases above 1 LSB for an 18-bit DAC. The INL 1004 with the common ground control circuitry 354B varies some as a function of code, but the variance is limited to about 0.1 LSB of an 18-bit DAC. The INL 1006 with the common ground control circuitry 354A stays near zero and offers the best INL reduction for an 18-bit DAC.

The graph 1000 shows INL improvement due to common ground control circuitry options and does not show INL improvements due to leakage current reduction. As represented in graph 1000, use of the common ground control circuitry 354A of FIG. 8A results in INL reduction (relative to not using the common ground control circuitry of FIG. 8A) from above 1-LSB to an INL approximating 0. Use of the common ground control circuitry 354B of FIG. 9 results in INL reduction (relative to not using the common ground control circuitry of FIG. 9) from above 1-LSB to an INL approximating 0.1 LSB. Leakage current reduction is another INL reduction option which may be used instead of, or in addition to, common ground control circuitry. In a worst-case leakage current scenario, leakage current reduction can reduce INL due to switch leakage from 15-LSB to approximately 1-LSB. With both options implemented (leakage current reduction and common ground control circuitry), the resulting INL is mostly due to residual switch leakage since the INL due to common ground impedance becomes very low.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

While the use of particular transistors is described herein, other transistors (or equivalent devices) may be used instead with little or no change to the remaining circuitry. For example, a field effect transistor ("FET") such as an NFET or a PFET, a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control terminal and its first and second terminals. In the context of a FET, the control terminal is the gate, and the first and second terminals are the drain and source. In the context of a BJT, the control terminal is the base, and the first and second terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

The invention claimed is:

1. A circuit comprising:
  a digital-to-analog converter (DAC) having an input and an output; and
  a gain stage having an input and an output, the input of the gain stage coupled to the output of the DAC, and the gain stage including:
    an operational amplifier having a first input, a second input, and an output, the first input of the operational amplifier coupled to the input of the gain stage, the output of the operational amplifier coupled to the output of the gain stage;
    a variable gain network having a first terminal, a second terminal, and a third terminal, the first terminal of the variable gain network coupled to the second input of the operational amplifier, the second terminal of the variable gain network coupled to the output of the operational amplifier; and
    a leakage current control circuit having a first terminal and a second terminal, the first terminal of the leakage current control circuit coupled to the output of the operational amplifier, and the second terminal of the leakage current control circuit coupled to the third terminal of the variable gain network.

2. The circuit of claim 1, wherein the variable gain network includes:
  a first resistor having a first terminal and a second terminal, the first terminal of the first resistor coupled to the output of the operational amplifier, and the second terminal of the first resistor coupled to the second input of the operational amplifier;
  a second resistor having a first terminal and a second terminal, the first terminal of the second resistor coupled to the second terminal of the first resistor;
  a first transistor having a first terminal, a second terminal, and a control terminal, the first terminal of the first transistor coupled to the second terminal of the second resistor, the second terminal of the first transistor coupled to the third terminal of the variable gain network; and
  a second transistor having a first terminal, a second terminal, and a control terminal, the first terminal of the second transistor coupled to the second terminal of the first transistor.

3. The circuit of claim 2, wherein the variable gain network includes:
  a third resistor having a first terminal and a second terminal, the first terminal of the third resistor coupled to the second terminal of the first resistor;
  a third transistor having a first terminal, a second terminal, and a control terminal, the first terminal of the third transistor coupled to the second terminal of the third resistor, the second terminal of the third transistor coupled to the third terminal of the variable gain network; and
  a fourth transistor having a first terminal, a second terminal, and a control terminal, the first terminal of the fourth transistor coupled to the second terminal of the third transistor.

4. The circuit of claim 3, wherein the variable gain network has a fourth terminal and includes a fifth transistor having a first terminal, a second terminal, and a control terminal, the first terminal of the fifth transistor coupled to the second terminal of the third resistor, the second terminal of the fifth transistor coupled to the fourth terminal of the variable gain network.

5. The circuit of claim 4, wherein the leakage current control circuit includes:
  a fourth resistor having a first terminal and a second terminal, the first terminal of the fourth resistor coupled to the output of the operational amplifier, and the second terminal of the fourth resistor coupled to the second terminal of the leakage current control circuit;
  a fifth resistor having a first terminal and a second terminal, the first terminal of the fifth resistor coupled to the second terminal of the fourth resistor;
  a sixth transistor having a first terminal, a second terminal, and a control terminal, the first terminal of the sixth transistor coupled to the second terminal of the fifth resistor; and
  a seventh transistor having a first terminal, a second terminal, and a control terminal, the first terminal of the seventh transistor coupled to the second terminal of the sixth transistor.

6. The circuit of claim 5, wherein the leakage current control circuit includes:
  a sixth resistor having a first terminal and a second terminal, the first terminal of the sixth resistor coupled to the second terminal of the fourth resistor;
  an eighth transistor having a first terminal, a second terminal, and a control terminal, the first terminal of the eighth transistor coupled to the second terminal of the sixth resistor; and
  a ninth transistor having a first terminal, a second terminal, and a control terminal, the first terminal of the ninth transistor coupled to the second terminal of the eighth transistor.

7. The circuit of claim 6, wherein the leakage current control circuit has a third terminal and includes a tenth transistor having a first terminal, a second terminal, and a control terminal, the first terminal of the tenth transistor coupled to the second terminal of the sixth resistor, the second terminal of the tenth transistor coupled to the third terminal of the leakage current control circuit.

8. The circuit of claim 1, wherein the DAC has a first ground terminal, the gain stage has a second ground terminal, and the circuit includes common ground control circuitry having a first terminal, a second terminal, a third terminal, the first terminal of the common ground control circuitry coupled to the first ground terminal, the second terminal of the common ground control circuitry coupled to the second ground terminal.

9. The circuit of claim 8, further comprising:
  a landing pad including a first metal layer, a second metal layer, and a third metal layer, the second metal layer of the landing pad coupled to the first terminal of the common ground control circuitry, and the third metal layer of the landing pad coupled to the second terminal of the common ground control circuitry;
a first set of metal vias between first and second metal layers;
a second set of metal vias between the second and third metal layers;
a ground buffer having a first terminal, a second terminal, and a third terminal, the first terminal of the ground buffer coupled to the first metal layer of the landing pad, the second terminal of the ground buffer coupled to the third terminal of the common ground control circuitry, and the third terminal of the ground buffer coupled to the third metal layer of the landing pad.

10. The circuit of claim 8, further comprising:
a landing pad including a first metal layer, a second metal layer, and a third metal layer, the first metal layer of the landing pad coupled to the first terminal of the common ground control circuitry, the second metal layer of the landing pad coupled to the second terminal of the common ground control circuitry, and the third metal layer of the landing pad coupled to the third terminal of the common ground control circuitry;
a first set of metal vias between first and third metal layers;
a second set of metal vias between the second and third metal layers; and
a ground current compensation circuit having an output coupled to the second terminal of the common ground control circuitry, the ground current compensation circuit configured to vary a compensation current at its output responsive to a code received at the input of the DAC.

11. A circuit comprising:
common ground control circuitry having a first terminal, a second terminal, a third terminal;
a digital-to-analog converter (DAC) having an input, an output, and a first ground terminal, the first ground terminal coupled to the first terminal of the common ground control circuitry; and
a gain stage having an input, an output, and a second ground terminal, the input of the gain stage coupled to the output of the DAC, the second ground terminal coupled to the second terminal of the common ground control circuitry, and the gain stage including:
an operational amplifier having a first input, a second input, and an output, the first input of the operational amplifier coupled to the input of the gain stage, the output of the operational amplifier coupled to the output of the gain stage;
a variable gain network having a first terminal, a second terminal, and a third terminal, the first terminal of the variable gain network coupled to the second input of the operational amplifier, the second terminal of the variable gain network coupled to the output of the operational amplifier; and
a leakage current control circuit having a first terminal and a second terminal, the first terminal of the leakage current control circuit coupled to the output of the operational amplifier, and the second terminal of the leakage current control circuit coupled to the third terminal of the variable gain network.

12. The circuit of claim 11, wherein the variable gain network has a fourth terminal and includes:
a first resistor having a first terminal and a second terminal, the first terminal of the first resistor coupled to the output of the operational amplifier, and the second terminal of the first resistor coupled to the second input of the operational amplifier;
a second resistor having a first terminal and a second terminal, the first terminal of the second resistor coupled to the second terminal of the first resistor;
a first transistor having a first terminal, a second terminal, and a control terminal, the first terminal of the first transistor coupled to the second terminal of the second resistor, the second terminal of the first transistor coupled to the third terminal of the variable gain network;
a second transistor having a first terminal, a second terminal, and a control terminal, the first terminal of the second transistor coupled to the second terminal of the first transistor;
a third resistor having a first terminal and a second terminal, the first terminal of the third resistor coupled to the second terminal of the first resistor;
a third transistor having a first terminal, a second terminal, and a control terminal, the first terminal of the third transistor coupled to the second terminal of the third resistor, the second terminal of the third transistor coupled to the third terminal of the variable gain network;
a fourth transistor having a first terminal, a second terminal, and a control terminal, the first terminal of the fourth transistor coupled to the second terminal of the third transistor; and
a fifth transistor having a first terminal, a second terminal, and a control terminal, the first terminal of the fifth transistor coupled to the second terminal of the third resistor, the second terminal of the fifth transistor coupled to the fourth terminal of the variable gain network.

13. The circuit of claim 12, wherein the leakage current control circuit has a third terminal and includes:
a fourth resistor having a first terminal and a second terminal, the first terminal of the fourth resistor coupled to the output of the operational amplifier, and the second terminal of the fourth resistor coupled to the second terminal of the leakage current control circuit;
a fifth resistor having a first terminal and a second terminal, the first terminal of the fifth resistor coupled to the second terminal of the fourth resistor;
a sixth transistor having a first terminal, a second terminal, and a control terminal, the first terminal of the sixth transistor coupled to the second terminal of the fifth resistor;
a seventh transistor having a first terminal, a second terminal, and a control terminal, the first terminal of the seventh transistor coupled to the second terminal of the sixth transistor;
a sixth resistor having a first terminal and a second terminal, the first terminal of the sixth resistor coupled to the second terminal of the fourth resistor;
an eighth transistor having a first terminal, a second terminal, and a control terminal, the first terminal of the eighth transistor coupled to the second terminal of the sixth resistor;
a ninth transistor having a first terminal, a second terminal, and a control terminal, the first terminal of the ninth transistor coupled to the second terminal of the eighth transistor; and
a tenth transistor having a first terminal, a second terminal, and a control terminal, the first terminal of the tenth transistor coupled to the second terminal of the sixth resistor, the second terminal of the tenth transistor coupled to the third terminal of the leakage current control circuit.

14. The circuit of claim 11, further comprising a ground buffer having a first terminal, a second terminal, and an output, the first terminal of the ground buffer coupled to the third terminal of the common ground control circuitry, and the output of the ground buffer coupled to the second terminal of the common ground control circuitry.

15. The circuit of claim 11, further comprising a ground current compensation circuit having an output coupled to the second terminal of the ground current compensation circuit, the ground current compensation circuit configured to vary a compensation current at its output responsive to a code received at the input of the DAC.

16. The circuit of claim 11, wherein the common ground control circuitry includes a first metal layer of an integrated circuit (IC) coupled to the first terminal of the common ground control circuitry, a second metal layer of the IC coupled to the second terminal of the common ground control circuitry, a third metal layer of the IC coupled to the third terminal of the common ground control circuitry, a first resistor between the first metal layer and the second metal layer, and a second resistor between the second metal layer and the third metal layer.

17. A circuit comprising:
a digital-to-analog converter (DAC) having an input, an output, and a first ground terminal, the DAC configured to:
receive a code at its input; and
provide an analog signal at its output responsive to the code;
a gain stage having a first input, a second input, an output, and a second ground terminal, the input of the gain stage coupled to the output of the DAC, and the gain stage configured to:
receive the analog signal at its first input;
receive a gain control signal at its second input;
generate a leakage current control signal based on the analog signal; and
provide an output voltage responsive to the analog signal, the gain control signal, and the leakage current control signal; and
common ground control circuitry having a first terminal, a second terminal, and a third terminal, the first terminal of the common ground control circuitry coupled to the first ground terminal, the second terminal of the common ground control circuitry coupled to the second ground terminal, and the common ground control circuitry configured to:
provide a first impedance between the first and third terminals of the common ground control circuitry; and
provide a second impedance between the second and third terminals of the common ground control circuitry.

18. The circuit of claim 17, wherein the gain stage includes a variable gain network and the gain stage is configured to generate the leakage current control signal based on a replica network of the variable gain network, the replica network using higher resistor values than the variable gain network, and the leakage current control signal approximating the analog signal.

19. The circuit of claim 17, wherein the common ground control circuitry includes a ground current compensation circuit having an output coupled to the second terminal of the common ground control circuitry, the ground current compensation circuit configured to vary a compensation current at its output responsive to the code received at the input of the DAC.

20. The circuit of claim 17, further comprising a ground buffer having a first terminal, a second terminal, and an output, the first terminal of the ground buffer coupled to the third terminal of the common ground control circuitry, and the output of the ground buffer coupled to the second terminal of the common ground control circuitry.

* * * * *